(12) United States Patent
Liu (10) Patent No.: US 11,211,365 B1
(45) Date of Patent: Dec. 28, 2021

(54) MINI LED BACKLIGHT PANEL AND BACKLIGHT MODULE

(71) Applicant: WUHAN CHINA STAR OPTOELECTRONICS TECHNOLOGY CO., LTD., Hubei (CN)

(72) Inventor: Fancheng Liu, Hubei (CN)

(73) Assignee: WUHAN CHINA STAR OPTOELECTRONICS TECHNOLOGY CO. LTD., Hubei (CN)

( * ) Notice: Subject to any disclaimer, the term of this patent is extended or adjusted under 35 U.S.C. 154(b) by 260 days.

(21) Appl. No.: 16/623,721

(22) PCT Filed: Oct. 31, 2019

(86) PCT No.: PCT/CN2019/114606
§ 371 (c)(1),
(2) Date: Dec. 17, 2019

(87) PCT Pub. No.: WO2021/000472
PCT Pub. Date: Jan. 7, 2021

(30) Foreign Application Priority Data

Jul. 1, 2019 (CN) .......................... 201910584459.3

(51) Int. Cl.
*H01L 25/075* (2006.01)
*H01L 33/50* (2010.01)

(52) U.S. Cl.
CPC ........ *H01L 25/0753* (2013.01); *H01L 33/507* (2013.01)

(58) Field of Classification Search
CPC .......................... H01L 25/0753; H01L 33/507
See application file for complete search history.

(56) References Cited

U.S. PATENT DOCUMENTS

| | | | |
|---|---|---|---|
| 10,732,920 B2* | 8/2020 | Nagayama | ........... H05K 5/0021 |
| 2008/0037284 A1* | 2/2008 | Rudisill | ................. F21S 2/005 |
| | | | 362/629 |
| 2009/0296026 A1* | 12/2009 | Bae | .................. G02F 1/133615 |
| | | | 349/65 |

(Continued)

FOREIGN PATENT DOCUMENTS

| CN | 109613758 A | 4/2019 |
|---|---|---|
| EP | 3467579 A1 | 4/2019 |

*Primary Examiner* — Victor A Mandala
(74) *Attorney, Agent, or Firm* — Berger Singerman LLP; Geoffrey Lottenberg (57) ABSTRACT

A mini light emitting diode (LED) backlight panel is provided, which includes a plurality of backlight sub-panels in a docking way. A light-filling region is disposed between the arbitrary adjacent two backlight sub-panels. Fluorescent powder or quantum dots are filled in the light-filling region. The mini LED backlight panel emits light to excite material of the light-filling region to emit light. Secondly, adopting design solutions of large and small light emitting angles in mixed arrangement on different heights of the light emitting surfaces in the mini LED backlight panel, improving brightness on the splicing position, thereby improving quality of light emitted from the mini LED backlight panel, and meanwhile is advantageous for an ultra-thin design of the backlight module.

10 Claims, 4 Drawing Sheets

(56) References Cited

U.S. PATENT DOCUMENTS

| | | | |
|---|---|---|---|
| 2012/0182718 A1* | 7/2012 | Yi | G06F 1/1647 362/97.1 |
| 2017/0090230 A1* | 3/2017 | Yoon | G02F 1/13336 |
| 2018/0315355 A1* | 11/2018 | Hu | G09G 3/34 |
| 2019/0107260 A1 | 4/2019 | Adema et al. | |
| 2019/0198575 A1* | 6/2019 | Liu | G02B 5/003 |
| 2020/0388636 A1* | 12/2020 | Yueh | H01L 25/0655 |

* cited by examiner

MINI LED BACKLIGHT PANEL AND BACKLIGHT MODULE

CROSS-REFERENCE TO RELATED APPLICATIONS

This application is the National phase under 35 U.S.C. § 371 of International Application No. PCT/CN2019/114606, filed Oct. 31, 2019, which claims the benefit of and priority to Chinese Patent Application No. 201910584459.3, filed Jul. 1, 2019. The entire contents of these patent applications are hereby incorporated by reference herein.

FIELD OF INVENTION

The present disclosure relates to field of display technology, and particularly to a mini light emitting diode (LED) backlight panel and backlight module.

BACKGROUND OF INVENTION

Mini light emitting diode (LED) chips are chips which have a size about 100 μm×100 μm, and have advantages, such as high color saturation, enable local dimming, high brightness, energy conservation, and can be applied in backlight displays.

Figure 1:
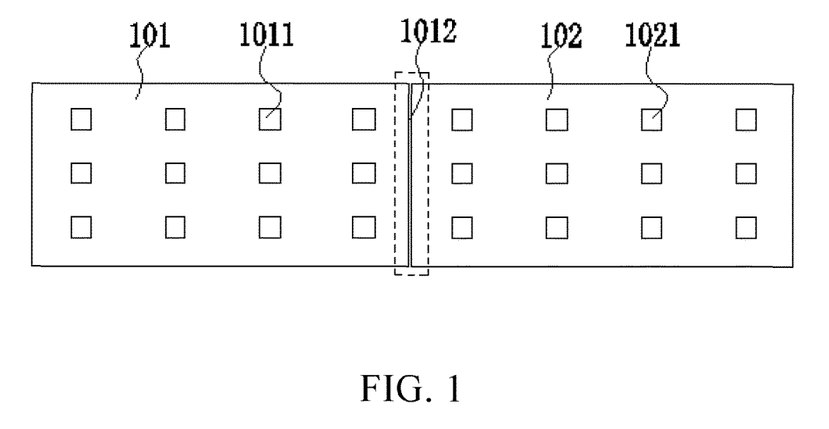
FIG. 1 is a structural schematic diagram of a mini LED backlight panel in prior art.

As illustrated in FIG. 1, generally, large size mini LED backlight panels adopt a method of splicing multiple light plates to realize a larger size. The left side light plate 101 and the right side light plate 102 are spliced together to generate a splicing position 1012. Further, a plurality of LED light sources 1011 and LED light sources 1021 are disposed on the left side light plate 101 and the right side light plate 102, respectively. Due to problems such as warpage, unevenness, fracture, light truncation, and cutting of black edges on the splicing position 1012, a dark line is generated on the splicing position of the mini LED light panel.

In summary, it is necessary to design a new structure to solve the technical problem that the dark line is generated on the splicing position of the mini LED light panel, and hue of the splicing position is not consistent with brightness of normal light emitting regions, thereby affecting light extraction quality in the backlight module.

SUMMARY OF INVENTION

The purpose of the present disclosure is to provide a mini light emitting diode (LED) backlight panel and a backlight module which can solve the technical problem that the dark line is generated on the splicing position of the mini LED light panel, and hue of the splicing position is not consistent with brightness of normal light emitting regions, thereby affecting light extraction quality in the backlight module.

In order to solve the problems mentioned above, embodiments of the present disclosure provide a mini LED backlight panel. The mini LED backlight panel includes a first backlight sub-panel and a second backlight sub-panel disposed in a docking way. A splicing position of the first backlight sub-panel and the second backlight sub-panel is disposed as a light-filling region. A light-filling material is disposed in the light-filling region.

Further, the light-filling material is fluorescent powder or quantum dot particles.

Further, a height of the first backlight sub-panel is same as a height of a light emitting surface of the second backlight sub-panel. The first backlight sub-panel and the second backlight sub-panel are spaced apart to form the light-filling region therebetween. The light-filling material is disposed in the light-filling region.

Further, a shape and a size of the first backlight sub-panel and a shape and a size of the second backlight sub-panel are same.

Further, a height of a light emitting surface of the first backlight sub-panel is less than a height of a light emitting surface of the second backlight sub-panel. A notch is disposed on a bottom section of a side of the second backlight sub-panel. An end of the first backlight sub-panel is connected into the notch, and a connection length ranges from 1 to 3 light source pitches.

Further, the light-filling region is located on an intersection of a surface of the first backlight sub-panel and an end of the second backlight sub-panel, and a light-filling layer of the light-filling region is used for connecting to a fluorescent layer in the first backlight sub-panel and the second backlight sub-panel.

Further, a height of the light-filling layer ranges from 0.01 mm to 1 mm. A light emitting angle of a first LED light source in the first backlight sub-panel is θ1. A light emitting angle of a second LED light source in the second backlight sub-panel is θ2, and θ1 is equal to θ2.

Further, the height of the light-filling layer is greater than 1 mm. The light emitting angle of a first LED light source in the first backlight sub-panel is θ1. The light emitting angle of the second LED light source in the second backlight sub-panel is θ2, and θ1 is less than θ2.

In order to solve problems mentioned above, the present disclosure further provides a backlight module. The backlight module includes:

A back plate, including a reinforcing plate, and an adhesive, located on a surface of the reinforcing plate.

A mini light emitting diode (LED) backlight panel, located on a surface of the back plate, and the mini LED backlight panel including: a first backlight sub-panel and a second backlight sub-panel disposed in a docking way. A splicing position of the first backlight sub-panel and the second backlight sub-panel is disposed as a light-filling region, and a light-filling material is disposed in a light-filling layer of the light-filling region. The light-filling material is fluorescent powder or quantum dot particles.

An optical film material, located above the mini LED backlight panel, and used for aggregating a light emitted from the mini LED backlight panel within a preset region to emit to improve brightness of the mini LED backlight panel.

Further, a height of a light emitting surface of the first backlight sub-panel is less than a height of a light emitting surface of the second backlight sub-panel. A notch is disposed on a bottom section of a side of the second backlight sub-panel. An end of the first backlight sub-panel is connected into the notch, and a connection length ranges from 1 to 3 light source pitches.

Further, a height of the light-filling layer ranges from 0.1 mm to 1 mm. A light emitting angle of a first LED light source in the first backlight sub-panel is θ1. A light emitting angle of a second LED light source in the second backlight sub-panel is θ2, and θ1 is equal to θ2.

Further, the height of the light-filling layer is greater than 1 mm. The light emitting angle of a first LED light source in the first backlight sub-panel is θ1. The light emitting angle of the second LED light source in the second backlight sub-panel is θ2, and θ1 is less than θ2.

The beneficial effect of the present disclosure is that the light-filling material is filled between the arbitrary adjacent two backlight sub-panels in the mini LED backlight panel.

The light-filling material is fluorescent powder or quantum dots, and the light-filling material makes colors of the splicing position remain consistent with other regions, and ensure appearance of the mini LED backlight panel be flat. When the backlight module is in a bright state, the mini LED backlight panel emits light to excite the light-filling material on the splicing position, so that the hue of the splicing position is consistent with normal regions, thereby improving brightness on the splicing position and avoiding color difference on the splicing position, thereby improving quality of light emitted from the mini LED backlight panel. Secondly, adopting design solutions of large and small light emitting angles in mixed arrangement on different heights of the light emitting surfaces in the mini LED backlight panel is advantageous for an ultra-thin design of the backlight module.

DESCRIPTION OF DRAWINGS

To more clearly illustrate the technical solutions of the embodiments of the present disclosure, the accompanying figures of the present disclosure will be described in brief. Obviously, the accompanying figures described below are only part of the embodiments of the present disclosure, from which figures those skilled in the art can derive further figures without making any inventive efforts.

DETAILED DESCRIPTION OF PREFERRED EMBODIMENTS

The present disclosure will be further described in detail as follow with reference to the accompanying drawings and embodiments. It should be specially pointed out, that the following embodiments are used for describing the present disclosure, but are not intended to limit the scope of the present disclosure. As same, the following embodiments are only partial embodiments of the present disclosure, and not all the embodiments. All other embodiments obtained by those skilled in the art without creative efforts are within the scope of the present disclosure.

The present disclosure aims at addressing the technical problem that the dark line is generated on the splicing position of the mini light emitting diode (LED) light panel, and hue of the splicing position is not consistent with brightness of normal light emitting regions, thereby affecting light extraction quality in the backlight module. The present disclosure can solve the defect.

An embodiment of the present disclosure provides a mini LED backlight panel, including a first backlight sub-panel and a second backlight sub-panel disposed in a docking way. A splicing position of the first backlight sub-panel and the second backlight sub-panel is disposed as a light-filling region. A light-filling material is disposed in the light-filling region.

The embodiment is not limited to splicing two backlight sub-panels, but also can dispose a plurality of backlight sub-panels to splice to each other. A light-filling region is disposed on a splicing position of the arbitrary adjacent two backlight sub-panels. The light-filling region can be located between the adjacent two backlight sub-panels, and also can be located on an intersection of the adjacent two backlight sub-panels. The light-filling region is for realizing brightness of light emitted from the adjacent two backlight sub-panels to be same as a light line emitted from the backlight sub-panel, and for realizing appearance to be flat and beautiful. Light-filling material is disposed in the light-filling region. The light-filling material includes color conversion material, such as fluorescent powder, or quantum dots. For example, blue light is emitted from the backlight sub-panel, after passing through the color conversion material, the blue light is converted in to red light, green light, or blue light, thereby realizing three colors light of red light, green light, and blue light.

A LED light source in an arbitrary backlight sub-panel is disposed in a white ink layer of the backlight sub-panel, and is protruded from a surface of the white ink layer and is extended into a fluorescent layer of the backlight sub-panel. Further, after the LED light source close to the light-filling region in the backlight sub-panel emitting light, the light passes through a light-filling layer in the light-filling region to convert into corresponding light, and propagates out. Part of the reflected light is not absorbed by the light-filling layer. When the part of the light passes through an upper surface of the white ink layer, it is reflected on the upper surface of the white ink layer, and is again converted by the light-filling layer, converting into corresponding light, it propagates out and improving light extraction efficiency of the light-filling layer, thereby improving light extraction efficiency of the whole mini LED backlight panel.

Figure 2:
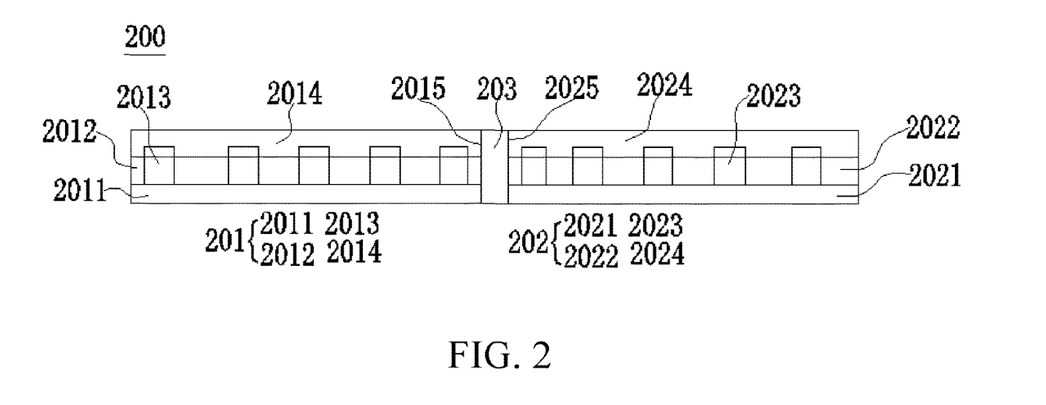
FIG. 2 is a structural schematic diagram of a mini LED backlight panel provided by an embodiment of the present disclosure.

As illustrated in FIG. 2, an embodiment of the present disclosure provides a mini LED backlight panel 200 including a first backlight sub-panel 201 and a second backlight sub-panel 202 disposed in a docking way. A height of a light emitting surface of the first backlight sub-panel 201 is equal to a height of a light emitting surface of the second backlight sub-panel 202. The first backlight sub-panel 201 and the second backlight sub-panel 202 are spaced apart to form a light-filling region 203 therebetween, that is, the region between an end surface 201S and an end surface 202S. A light-filling material is disposed in the light-filling region 203. The light-filling material is fluorescent powder or quantum dot particles. A thickness of the light-filling layer of the light-filling region 203 is equal to or slightly thicker than a thickness of the fluorescent layer of the backlight sub-panel to ensure appearance of the mini LED backlight panel 200 to be flat. When the backlight module is in a bright state, the mini LED backlight panel emits light can also excite the fluorescent powder or the quantum dot particles on the light-filling region 203 to emit light, so that the hue of the light-filling region 203 is consistent with normal regions, thereby improving the brightness of the light-filling region 203, avoiding color difference on the light-filling region 203, and improving the uneven brightness problem of light-filling region 203, thereby improving quality of light emitted from the mini LED backlight panel 200.

A shape and a size of the first backlight sub-panel 201 and a shape and a size of the second backlight sub-panel 202 are same. The first backlight sub-panel 201 includes a first carrier 2011, a first white ink layer 2012, a first LED light source 2013, and a first fluorescent layer 2014. The second backlight sub-panel 202 includes a second carrier 2021, a second white ink layer 2022, a second LED light source 2023, and a second fluorescent layer 2024. The structure of the first backlight sub-panel 201 and function thereof are same as the corresponding structure of the second backlight sub-panel 202 and the corresponding function thereof.

Further, the first LED light source 2011 includes a circuit layer for providing electric energy to the first LED light source 2013. The first white ink layer 2012 is disposed on a surface of the first carrier 2011. The first LED light source 2013 is distributed in arrays in the first white ink layer 2012, and the first LED light source 2013 is protruded from a surface of the first white ink layer 2012 and is extended into the first fluorescent layer 2014. First concave structures are disposed on each upper surface of the first LED light source 2013. A LED chip is placed on bottom of the first concave structure. After the first LED light source 2013 emitting light, the light passes through the first fluorescent layer 2014 to convert into corresponding light and propagates out. Part of the light is not absorbed by the first fluorescent layer 2014, and the reflected light is reflected on an upper surface of the first white ink layer 2012, and again passes through the first fluorescent layer 2014 to convert into corresponding light, and propagates out, and improving light extraction efficiency of the first fluorescent layer 2014, thereby improving light extraction efficiency of the whole mini LED backlight panel 200.

A shape of the first backlight sub-panel 201 and a shape of the second backlight sub-panel 202 of this embodiment are same, and the first backlight sub-panel 201 and the second backlight sub-panel 202 are manufactured independently and produced in modularization to improve production efficiency of the backlight sub-panels. This embodiment is not limited to splicing two backlight sub-panels, but also disposing a plurality of backlight sub-panels to splice to each other. The light-filling material is filled in the light-filling region between the arbitrary adjacent two backlight sub-panels to improve quality of light emitted from the mini LED backlight panel 200.

Figure 3:
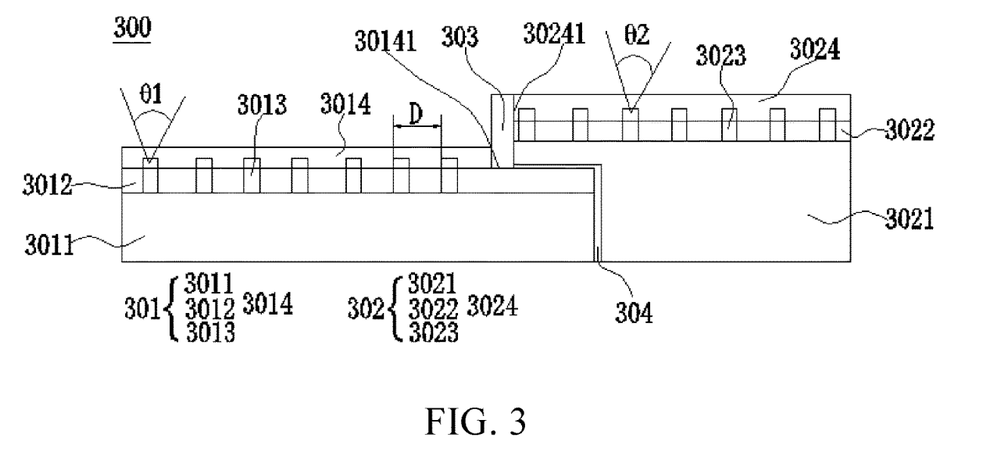
FIG. 3 is a structural schematic diagram of another mini LED backlight panel provided by an embodiment of the present disclosure.

As illustrated in FIG. 3, the present disclosure provides another mini LED backlight panel 300. A height of a light emitting surface of a first backlight sub-panel 301 is less than a height of a light emitting surface of a second backlight sub-panel 302. A notch 304 is disposed on a bottom section of a side of the second backlight sub-panel 302, and it is a stair shape. A shape of a cross section of the first backlight sub-panel 301 is a rectangular shape, and a height of the rectangular shape is same as a height of the notch 304. An end of the first backlight sub-panel 301 is connected into the notch 304, and a connection length ranges from 1 to 3 light source pitches D. Further, the light source pitch D is sum of a width of one LED light source and a gap between the adjacent two LED light sources. A second LED light source 3023 is disposed on a section where the second backlight sub-panel 302 is above the notch 304. The first LED light source 3013 is not disposed on the section where the first backlight sub-panel 301 is connected into the notch 304. The light-filling region 303 is located on a lateral surface 30141 of the first backlight sub-panel 301, and is bonded to a lateral surface 30241 of the second backlight sub-panel 302 adjacent to the first backlight sub-panel 301. That is, the light-filling region 303 is located on an intersection of the surface 30141 of the first backlight sub-panel 301 and the surface 30241 of the second backlight sub-panel 302, and a light-filling layer of the light-filling region 303 is used for connecting to the first backlight sub-panel 301 and the second backlight sub-panel 302. A light-filling material is disposed in the light-filling region 303. The light-filling material is fluorescent powder or quantum dot particles. A thickness of the light-filling layer of the light-filling region 303 is equal to or slightly thicker than a thickness of the fluorescent layer of the backlight sub-panel to ensure appearance of the mini LED backlight panel 300 to be flat. When the backlight module is in a bright state, the mini LED backlight panel emits light can also excite the fluorescent powder or the quantum dot particles on the light-filling region 303 to emit light, so that the hue of the light-filling region 303 is consistent with normal regions, thereby improving the brightness of the light-filling region 303, avoiding color difference on the light-filling region 303, and improving the uneven brightness problem of light-filling region 303, thereby improving quality of light emitted from the mini LED backlight panel 300.

A cross section of the first backlight sub-panel 301 in this embodiment is a rectangular shape, including a first carrier 3011, a first white ink layer 3012, a first LED light source 3013, and a first fluorescent layer 3014. Further, the first LED light source 3011 includes a circuit layer for providing electric energy to the first LED light source 3013. The first white ink layer 3012 is disposed on a surface of the first carrier 3011. The first LED light source 3013 is disposed in the first white ink layer 3012, and the first LED light source 3013 is protruded from a surface of the first white ink layer 3012 and is extended into the first fluorescent layer 3014. First concave structures are disposed on each upper surface of the first LED light source 3013. A LED chip is placed on bottom of the first concave structure. After the first LED light source 3013 emitting light, the light passes through the first fluorescent layer 3014 to convert into corresponding light and propagates out. Part of the reflected light is not absorbed by the first fluorescent layer 3014. The reflected light is reflected on an upper surface of the first white ink layer 3012, and again passes through the first fluorescent layer 3014 to convert into corresponding light and propagates out, and improving light extraction efficiency of the first fluorescent layer 3014, thereby improving light extraction efficiency of the whole mini LED backlight panel 300.

A cross section of the second backlight sub-panel 302 is a stair shape, including a second carrier 3021, a second white ink layer 3022, second LED light sources 3023, and a second fluorescent layer 3024. Further, the second LED light source 3021 includes a circuit layer for providing electric energy to the second LED light source 3023. The second white ink layer 3022 is disposed on a surface of the second carrier 3021. The plurality of the second LED light sources 3023 are spaced apart in the second white ink layer 3022, and the second LED light sources 3023 are protruded from a surface of the second white ink layer 3023 and are extended into the second fluorescent layer 3024. Second concave structures are disposed on each upper surface of the second LED light source 3023. A LED chip is placed on bottom of the second concave structure. After the second LED light source 3023 emitting light, the light passes through the second fluorescent layer 3024 to convert into corresponding light, and propagates out. Part of the reflected light reflected by the second fluorescent layer 3024 is reflected on an upper surface of the second white ink layer 3022, and again passes through the second fluorescent layer 3024 to convert into corresponding light and propagates out, and improving light extraction efficiency of the second fluorescent layer 3024, thereby improving light extraction efficiency of the whole mini LED backlight panel 300.

A shape of the first backlight sub-panel 301 and a shape of the second backlight sub-panel 302 of this embodiment are different, and the first backlight sub-panel 301 and the second backlight sub-panel 302 are manufactured independently and produced in modularization to improve production efficiency of the backlight sub-panels. This embodiment is not limited to splicing two backlight sub-panels, but also disposing a plurality of backlight sub-panels to splice to each other. The light-filling material is filled in the light-filling region between the arbitrary adjacent two backlight sub-panels to improve quality of light emitted from the mini LED backlight panel 300.

Figure 4:
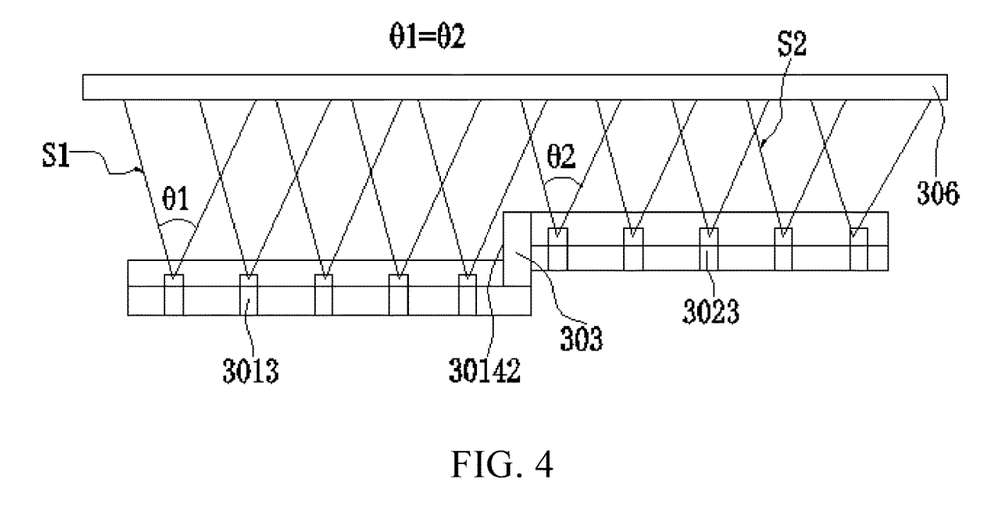
FIG. 4 is a schematic diagram of a light emitting angle of another mini LED backlight panel provided by an embodiment of the present disclosure.

As illustrated in FIG. 4, an embodiment of the present disclosure provides a schematic diagram of a light emitting angle of another mini LED backlight panel 300. A light emitting surface of the first backlight sub-panel 301 is lower than a light emitting surface of the second backlight sub-panel 302. When a height difference between the light emitting surface of the first backlight sub-panel 301 and the light emitting surface of the second backlight sub-panel 302 is small, a height of a light-filling layer in the light-filling layer 303 ranges from 0.01 mm to 1 mm, and a length of a side 30142 ranges from 0.01 mm to 1 mm, a light emitting angle of a first LED light source 3013 in the first backlight sub-panel 301 is θ1, a light emitting angle of a second LED light source 3023 in the second backlight sub-panel 302 is θ2, and θ1 is equal to θ2. Because the height of the light-filling layer in the light-filling region 303 is small, when lights emitted from the first LED light source 3013 and the second LED light source 3023 reach to a same preset horizontal position 306, a route length S1 of the light emitted from the first LED light source 3013 is equal to a route length S2 of the light emitted from the second LED light source 3023, ensuring brightness of emitting light sources of mini LED backlight panel 300 are consistent.

Figure 5:
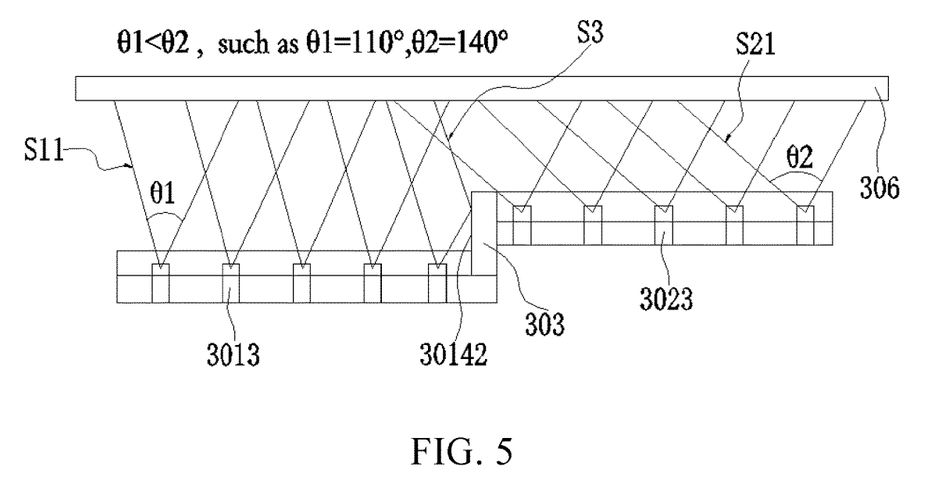
FIG. 5 is a schematic diagram of another light emitting angle of another mini LED backlight panel provided by an embodiment of the present disclosure.

As illustrated in FIG. 5, an embodiment of the present disclosure provides a schematic diagram of another light emitting angle of another mini LED backlight panel 300. A light emitting surface of the first backlight sub-panel 301 is lower than a light emitting surface of the second backlight sub-panel 302. When a height difference between the light emitting surface of the first backlight sub-panel 301 and the light emitting surface of the second backlight sub-panel 302 is large, a height of a light-filling layer in the light-filling layer 303 is greater than 1 mm, and a length of a side 30142 is greater than 1 mm, a light emitting angle of a first LED light source 3013 in the first backlight sub-panel 301 is θ1, a light emitting angle of a second LED light source 3023 in the second backlight sub-panel 302 is θ2, for example, θ1 is 110° and θ2 is 140°. When lights emitted from the first LED light source 3013 and the second LED light source 3023 reach to a same preset horizontal position 306, a route length S11 of the light emitted from the first LED light source 3013 is equal to a route length S21 of the light emitted from the second LED light source 3023. When the light emitted from the first LED light source 3013 close to the light-filling region 303 reaches the side 30142 of the light-filling layer in the light-filling region 303, the light will be reflected, such as the light S3, ensuring brightness of emitting light sources of mini LED backlight panel 300 are consistent.

Adopting a solution with a large emitting angles and a small light emitting angles in mixed arrangement on a high position and a low position, improving the uneven brightness phenomena on the splicing position of the backlight sub-panels, improving light extraction efficiency and light extraction quality of the whole mini LED backlight panel 300, and meanwhile being advantageous for an ultra-thin design of the backlight module. This embodiment is not limited to splicing two backlight sub-panels, but also disposing a plurality of backlight sub-panels to connect into each other. The light-filling material is filled in the light-filling region between the arbitrary adjacent two backlight sub-panels to improve quality of light emitted from the mini LED backlight panel.

Figure 6:
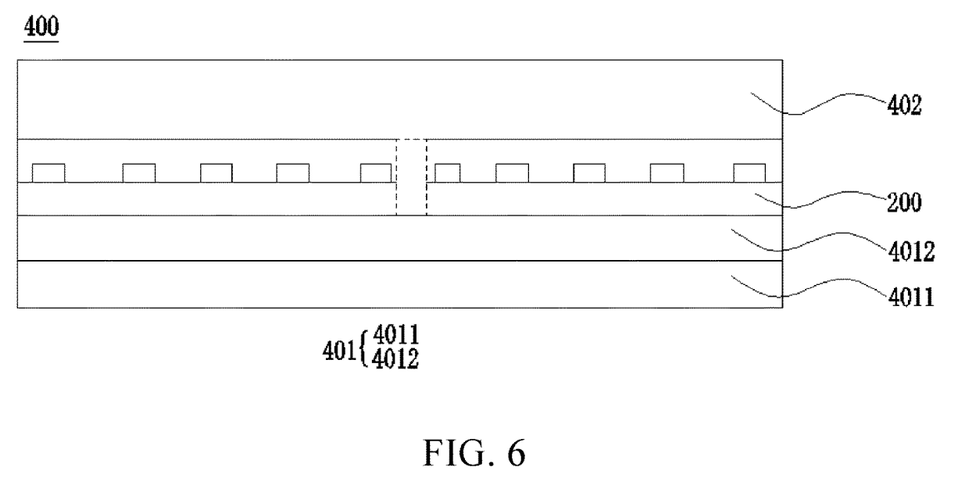
FIG. 6 is a structural schematic diagram of a backlight module provided by an embodiment of the present disclosure.

As illustrated in FIG. 6, based on the above-mentioned purpose of the present disclosure, providing a backlight module 400, including:

A back plate 401, including a reinforcing plate 4011 and an adhesive 4012 located on a surface of the reinforcing plate. Preferably, the reinforcing plate 4011 is aluminum alloy, and a thickness ranges from 10 um to 40 um, and a surface of the reinforcing plate 4011 is performed a grooving die-cut process, which is advantageous to the mini LED backlight panel 200 to dissipate heat. The adhesive 4012 is for fixing backlight sub-panels in the mini LED backlight panel 200.

The mini LED backlight panel 200 mentioned above is located on a surface of the back plate 401. Because space of FIG. 6 is limited, structures and regions of the mini LED backlight panel 200 is not labeled by symbols, the corresponding structures and regions are same as illustrated in FIG. 2. The mini LED backlight panel 200 includes a first backlight sub-panel 201 and a second backlight sub-panel 202 disposed in a docking way. The splicing position of the first backlight sub-panel 201 and the second backlight sub-panel 202 is disposed as a light-filling region 203. A light-filling material is disposed in a light-filling layer of the light-filling region 203. The light-filling material is fluorescent powder or quantum dot particles. A height of a light emitting surface of the first backlight sub-panel 201 is equal to a height of a light emitting surface of the second backlight sub-panel 202. The first backlight sub-panel 201 and the second backlight sub-panel 202 are spaced apart to form the light-filling region 203 therebetween. The light-filling material is disposed in the light-filling region 203. Further, a shape and a size of the first backlight sub-panel 201 and a shape and a size of the second backlight sub-panel 202 are same. The first backlight sub-panel 201 and the second backlight sub-panel 202 include a carrier, a white ink layer, a LED light source, and a fluorescent layer. The LED light source is disposed in the white ink layer, and is protruded from a surface of the white ink layer and is extended into the fluorescent layer.

An optical film material 402 located above the mini LED backlight panel 200 is used for aggregating a light emitted from the mini LED backlight panel 200 within a preset region to emit to improve brightness of the mini LED backlight module 400.

Figure 7:
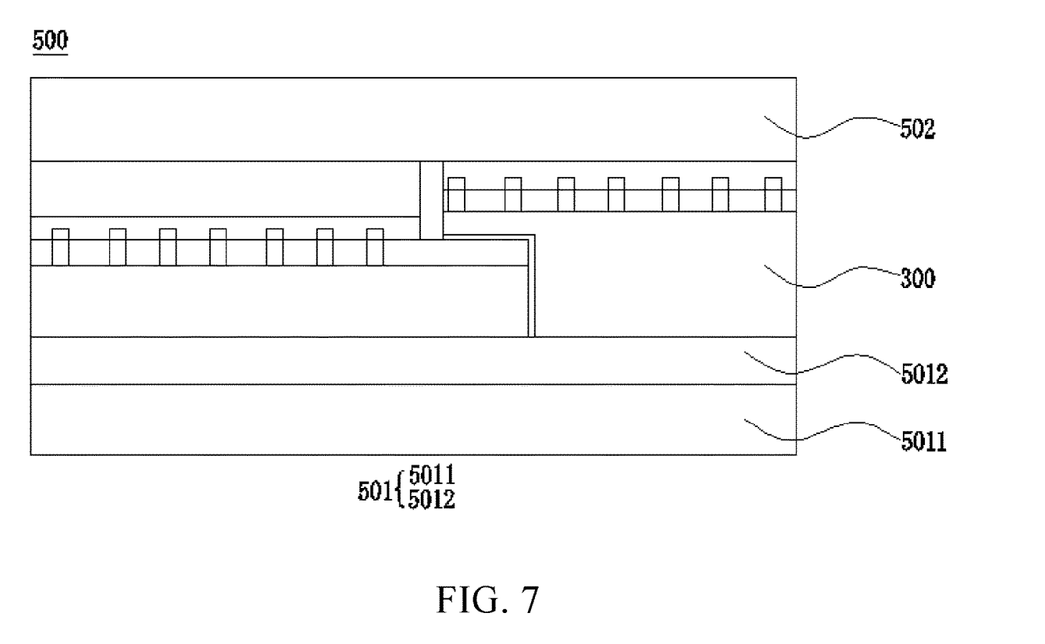
FIG. 7 is a structural schematic diagram of another backlight module provided by an embodiment of the present disclosure.

As illustrated in FIG. 7, based on the above-mentioned purpose of the present disclosure, providing a backlight module 500, including:

A back plate 501 includes a reinforcing plate 5011 and an adhesive 5012 is located on a surface of the reinforcing plate. Preferably, the reinforcing plate 5011 is aluminum alloy, and a thickness ranges from 10 um to 40 um, and a surface of the reinforcing plate 5011 is performed a grooving die-cut process, which is advantageous to the mini LED backlight panel 300 to dissipate heat. The adhesive 5012 is for fixing backlight sub-panels in the mini LED backlight panel 300.

The mini LED backlight panel 300 mentioned above is located on a surface of the back plate 501. Because space of FIG. 7 is limited, structures and regions of the mini LED backlight panel 300 is not labeled by symbols, the corresponding structures and regions are same as illustrated in FIG. 3. The mini LED backlight panel 300 includes a first backlight sub-panel 301 and a second backlight sub-panel 302 disposed in a docking way. The splicing position of the first backlight sub-panel 301 and the second backlight sub-panel 302 is disposed as a light-filling region 303. A light-filling material is disposed in a light-filling layer of the light-filling region 303. The light-filling material is fluorescent powder or quantum dot particles. A height of a light emitting surface of the first backlight sub-panel 301 is smaller than a height of a light emitting surface of the second backlight sub-panel 302. A notch 304 is disposed on a bottom section of a side of the second backlight sub-panel 302. An end of the first backlight sub-panel 301 is connected into the notch 304, and a connection length ranges from 1 to 3 light source pitches. A height of the light-filling layer ranges from 0.1 mm to 1 mm. A light emitting angle of a first LED light source 3013 in the first backlight sub-panel 301 is θ1. A light emitting angle of a second LED light source 3023 in the second backlight sub-panel 302 is θ2, and θ1 is equal to θ2. The height of the light-filling layer is greater than 1 mm. The light emitting angle of a first LED light source 3013 in the first backlight sub-panel 301 is θ1; or, the light emitting angle of the second LED light source 3023 in the second backlight sub-panel 302 is θ2, and θ1 is less than θ2, for example θ1=110°, and θ2=140°. Further, both the first backlight sub-panel 301 and the second backlight sub-panel 302 include a carrier, a white ink layer, a LED light source, and a fluorescent layer. The LED light source is disposed in the white ink layer, and is protruded from a surface of the white ink layer and is extended into the fluorescent layer.

An optical film material 502 located above the mini LED backlight panel 300 is used for aggregating a light emitted from the mini LED backlight panel 300 within a preset region to emit to improve brightness of the mini LED backlight module 500.

In the present disclosure, the light-filling material is filled between the arbitrary adjacent two backlight sub-panels in the mini LED backlight panel. The light-filling material is fluorescent powder or quantum dots, and the light-filling material makes colors of the splicing position remain consistent with other regions to ensure appearance of the mini LED backlight panel be flat. When the backlight module is in a bright state, the mini LED backlight panel emits light to excite the light-filling material on the splicing position, so that the hue of the splicing position is consistent with normal regions, thereby improving the brightness on the splicing position and avoiding color difference on the splicing position, thereby improving quality of light emitted from the mini LED backlight panel. Secondly, adopting design solutions of large and small light emitting angles in mixed arrangement on different heights of the light emitting surfaces in the mini LED backlight panel is advantageous for an ultra-thin design of the backlight module.

In summary, although the present disclosure has disclosed the preferred embodiments as above, however the above-mentioned preferred embodiments are not to limit to the present disclosure. A person skilled in the art can make any change and modification, therefore the scope of protection of the present disclosure is subject to the scope defined by the claims.

What is claimed is:

1. A mini light emitting diode (LED) backlight panel, comprising:
a first backlight sub-panel and a second backlight sub-panel disposed in a docking way; wherein, a splicing position of the first backlight sub-panel and the second backlight sub-panel is disposed as a light-filling region, and a light-filling material is disposed in the light-filling region.

2. The mini LED backlight panel as claimed in claim 1, wherein the light-filling material is fluorescent powder or quantum dot particles.

3. The mini LED backlight panel as claimed in claim 1, wherein a height of the first backlight sub-panel is same as a height of a light emitting surface of the second backlight sub-panel; the first backlight sub-panel and the second backlight sub-panel are spaced apart to form the light-filling region therebetween.

4. The mini LED backlight panel as claimed in claim 3, wherein a shape and a size of the first backlight sub-panel and a shape and a size of the second backlight sub-panel are same.

5. The mini LED backlight panel as claimed in claim 1, wherein a height of a light emitting surface of the first backlight sub-panel is less than a height of a light emitting surface of the second backlight sub-panel; a notch is disposed on a bottom section of a side of the second backlight sub-panel; an end of the first backlight sub-panel is connected into the notch, and a connection length ranges from 1 to 3 light source pitches.

6. The mini LED backlight panel as claimed in claim 5, wherein the light-filling region is located on an intersection of a surface of the first backlight sub-panel and an end of the second backlight sub-panel, and a light-filling layer of the light-filling region is used for connecting to a fluorescent layer in the first backlight sub-panel and the second backlight sub-panel.

7. The mini LED backlight panel as claimed in claim 6, wherein a height of the light-filling layer ranges from 0.01 mm to 1 mm; a light emitting angle of a first LED light source in the first backlight sub-panel is θ1; a light emitting angle of a second LED light source in the second backlight sub-panel is θ2, and θ1 is equal to θ2.

8. The mini LED backlight panel as claimed in claim 6, wherein a height of the light-filling layer is greater than 1 mm; a light emitting angle of a first LED light source in the first backlight sub-panel is θ1; a light emitting angle of a second LED light source in the second backlight sub-panel is θ2, and θ1 is less than θ2.

9. A backlight module comprising:
a back plate comprising a reinforcing plate and an adhesive located on a surface of the reinforcing plate;
a mini light emitting diode (LED) backlight panel located on a surface of the back plate, and the mini LED backlight panel comprising: a first backlight sub-panel and a second backlight sub-panel disposed in a docking way; a splicing position of the first backlight sub-panel and the second backlight sub-panel disposed as a light-filling region; a light-filling material disposed in the light-filling region; and the light-filling material is fluorescent powder or quantum dot particles; and
an optical film material located above the mini LED backlight panel, and is used for aggregating a light emitted from the mini LED backlight panel within a preset region to emit to improve brightness of the mini LED backlight panel.

10. The backlight module as claimed in claim 9, wherein a height of a light emitting surface of the first backlight sub-panel is less than a height of a light emitting surface of the second backlight sub-panel; a notch is disposed on a bottom section of a side of the second backlight sub-panel; an end of the first backlight sub-panel is connected into the notch, and a connection length ranges from 1 to 3 light source pitches;

a height of the light-filling layer ranges from 0.1 mm to 1 mm; a light emitting angle of a first LED light source in the first backlight sub-panel is $\theta 1$; a light emitting angle of a second LED light source in the second backlight sub-panel is $\theta 2$, and $\theta 1$ is equal to $\theta 2$; or the height of the light-filling layer is greater than 1 mm; the light emitting angle of a first LED light source in the first backlight sub-panel is $\theta 1$; the light emitting angle of the second LED light source in the second backlight sub-panel is $\theta 2$, and $\theta 1$ is less than $\theta 2$.

\* \* \* \* \*